United States Patent [19]
Yeh

[11] Patent Number: 5,722,839
[45] Date of Patent: Mar. 3, 1998

[54] ELECTRICAL CONNECTOR FOR HORIZONTAL INSERTION OF A CPU MODULE THEREIN

[76] Inventor: Te-Hsin Yeh, No. 45, Tung Yuan Road, Chungli, Taoyuan County, Taiwan

[21] Appl. No.: 764,125

[22] Filed: Dec. 12, 1996

[51] Int. Cl.[6] .................................................. H01R 9/09
[52] U.S. Cl. ............................................................ 439/79
[58] Field of Search ................................ 439/79, 80, 74, 439/64

[56] References Cited

U.S. PATENT DOCUMENTS

| | | | |
|---|---|---|---|
| 4,733,461 | 3/1988 | Nakano | 439/74 |
| 4,840,570 | 6/1989 | Mann, Jr. et al. | 439/74 |
| 5,556,286 | 9/1996 | Ikesugi et al. | 439/74 |

*Primary Examiner*—Neil Abrams
*Assistant Examiner*—Barry Standig

[57] ABSTRACT

An electrical connector for horizontal insertion of a CPU module therein includes a connector body and a terminal positioning plate. The connector body has a longitudinal insert slot for receiving a CPU module. An insert post is disposed at either end of an outer side opposite to the insert slot for securing each end of the terminal positioning plate. The terminal positioning plate is vertically secured at one lateral side of the outer side of the connector body and provided with a multiplicity of through holes corresponding to a multiplicity of terminals. The insert ends of the terminals extending from the connector body bend through 90 degrees and then pass through the through holes, securing the connector body on a circuit board in a horizontal position, thus the connector body may have its insert slot orient towards the side to allow the CPU module to be horizontally inserted therein.

6 Claims, 3 Drawing Sheets

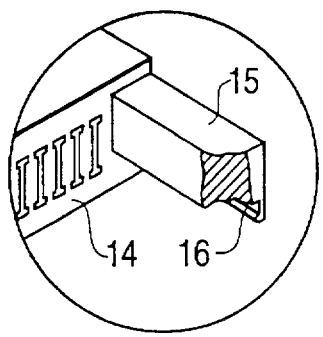
FIG. 1A
FIG. 1
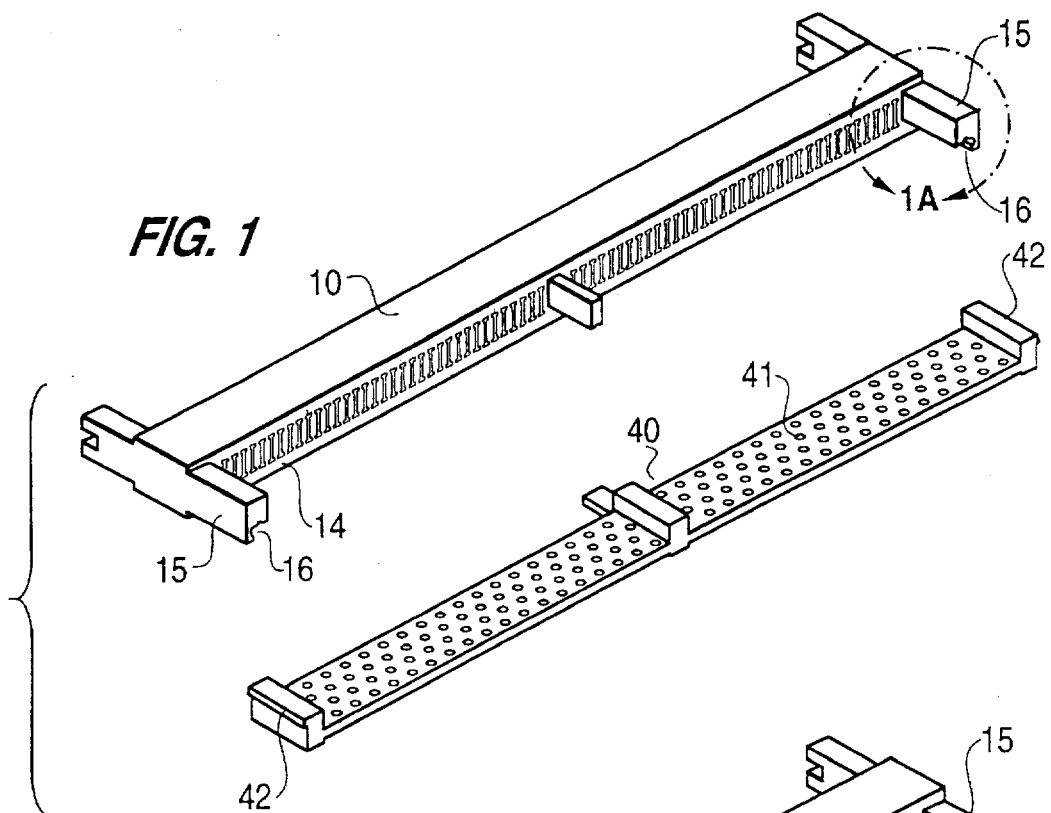
FIG. 2
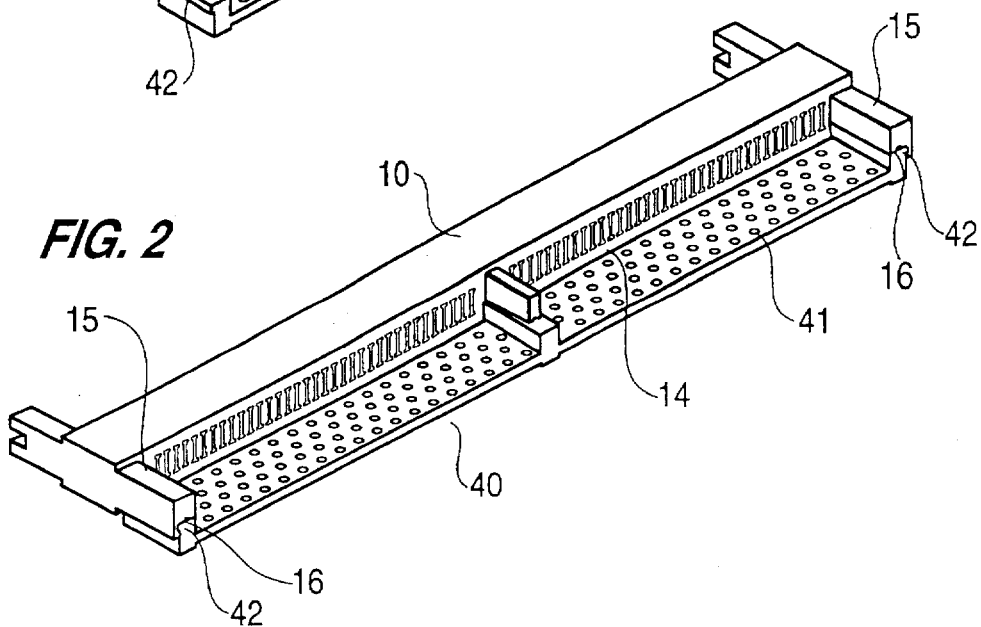

ELECTRICAL CONNECTOR FOR HORIZONTAL INSERTION OF A CPU MODULE THEREIN

BACKGROUND OF THE INVENTION (a) Field of the Invention

The present invention relates generally to an electrical connector, and more particularly to an electrical connector for horizontal insertion of a CPU module therein so as to effectively reduce the height of the computer mainframe.

(b) Description of the Prior Art

Most electrical connectors for CPU modules are mounted on circuit boards by means of the securing pins of the terminals at the lower side of the connectors inserting into the corresponding holes in the circuit boards. Although such a mode of securing the electrical connector on the circuit board has been widely adopted, since the CPU module is vertically inserted into a longitudinal insert slot of the electrical connector vertically mounted on the circuit board, the height of the motherboard cannot be reduced to achieve a more compact computer. This problem is more obvious in the case of computers using large CPU modules.

SUMMARY OF THE INVENTION

Accordingly, a primary object of the present invention is to provide an electrical connector in which a terminal positioning plate having a multiplicity of through holes is vertically disposed at one side of an outer side of a connector body so that the insert ends of terminals extending from the connector body may, after being bent through 90 degrees, pass through the through holes and couple the connector body to a circuit board in a horizontal manner, thus allowing a CPU module to be inserted horizontally into an insert slot of the connector body.

BRIEF DESCRIPTION OF THE DRAWINGS

The foregoing and other features and advantages of the present invention will be more clearly understood from the following detailed description and the accompanying drawings, in which, FIG. 1 is an elevational exploded view of the electrical connector of the present invention prior to the insertion of the terminals;

FIG. 1A is an enlarged elevational view of an insert post of the connector body of the present invention;

FIG. 2 is an elevational assembled view of the electrical connector of the present invention prior to the insertion of the terminals;

FIG. 3A is an enlarged elevational view illustrating the coupling of the insert posts and the terminal positioning plate;

FIG. 3B is a sectional view taken along line A—A of FIG. 3; and

DETAILED DESCRIPTION OF THE PREFERRED EMBODIMENT

Figure 3:
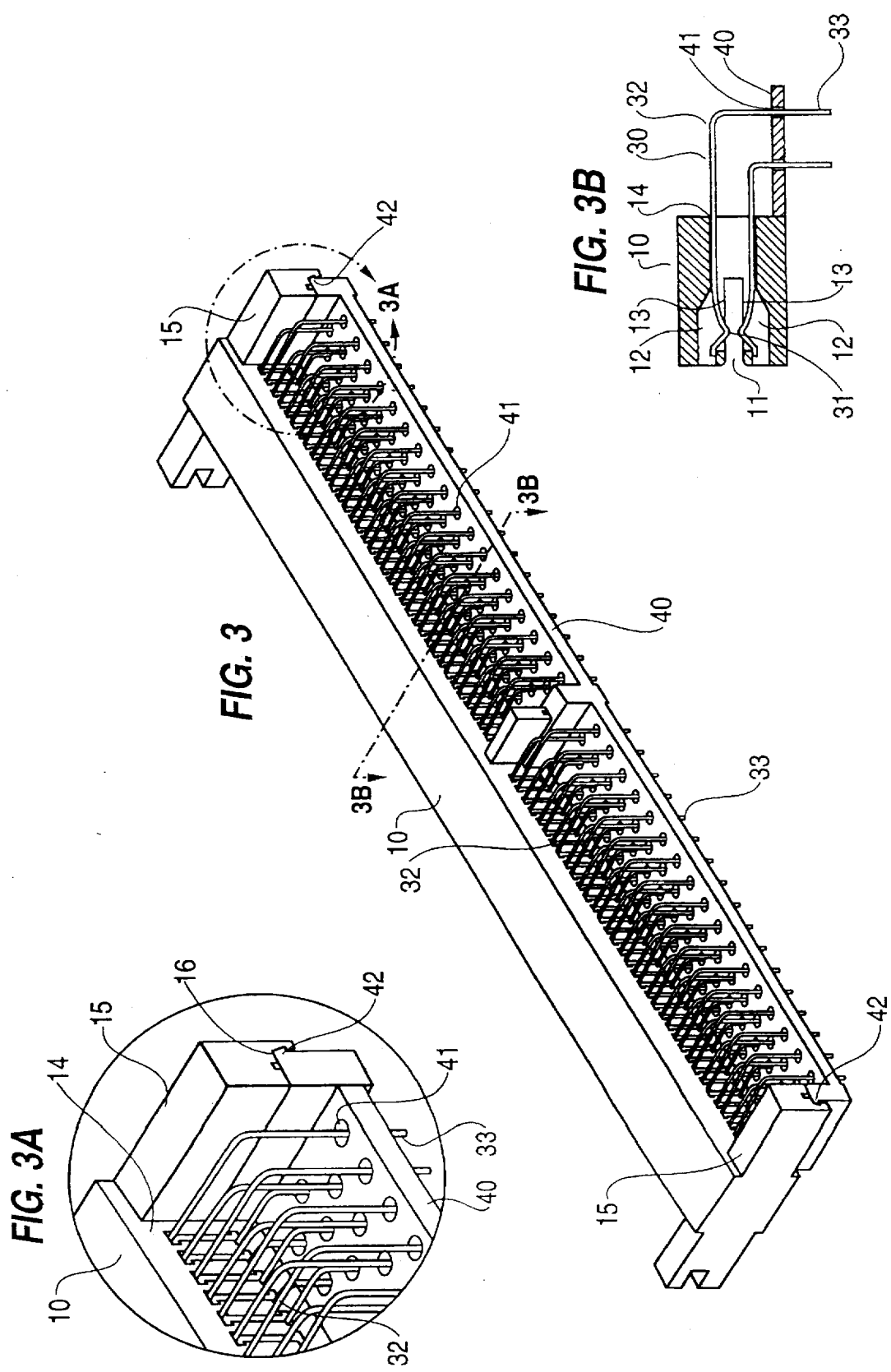
FIG. 3 is an elevational assembled view of the electrical connector of the present invention after the insertion of the terminals.

With reference to the drawings, the electrical connector for horizontal insertion of CPU modules disclosed in the present invention essentially comprises a connector body 10 and a terminal positioning plate 40. The connector body 10 is provided with a longitudinal insert slot 11 for receiving a CPU module unit 50, multiple terminal securing slots 12 arranged at the two side walls thereof, and multiple openings 13 disposed between the terminal securing slots 12 and the insert slot 11 for connecting the terminal securing slot 12 and the insert slot 11, thereby when terminals 30 are secured in the terminal securing slots 12, a protrudent contact end 31 of each terminal 30 may extend into the insert slot 11 so as to provide connection with a contact surface (not shown) of the CPU module unit 50. Additionally, at either end of an outer side 14 of the connector body 10 on the other side of the insert slot 11 is provided an insert post 15 having a female connecting portion 16 at one side.

Figure 4:
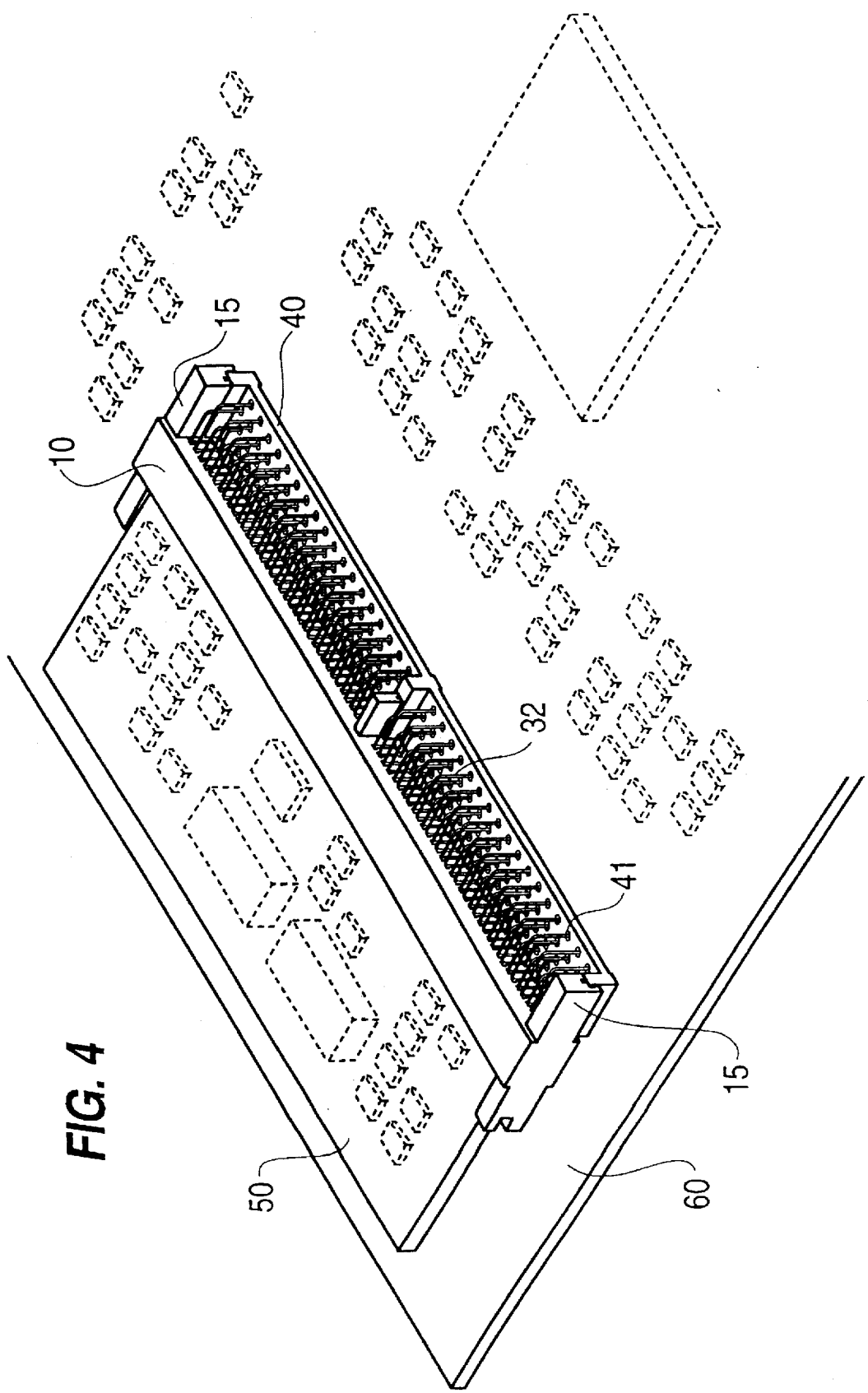
FIG. 4 is an elevational showing the present invention mounted on a circuit board.

The terminal positioning plate 40 is a plate of a suitable length. The terminal positioning plate 40 has a multiplicity of through holes 41 distributed on its surface. At either end thereof is provided a male connecting portion 42 for matching the female connecting portion 16 of the insert post 15 such that, after the male connecting portions 42 are coupled with the female connecting portions 15, the terminal positioning plate 40 may be vertically and fixedly disposed at one side of the outer side 14 of the connector body 10. Furthermore, since the terminal positioning plate 40 has multiple through holes 41 distributed thereon, the insert ends 32 of the terminals 30 extending outwardly from the connector body 10 may, after being bent through 90 degrees, pass through the corresponding through holes 41 of the terminal positioning plate 40. Therefore, when the extreme ends 33 of the terminals 30 extending from the terminal positioning plate 40 are utilized to secure on a circuit board 60, the connector body 10 may be horizontally secured on the circuit board 60, thus allowing the CPU module 50 to be horizontally inserted therein (as shown in FIG. 4).

In summary, by providing a terminal positioning plate at the side of the connector body, the connector body may be horizontally disposed on a circuit board, thus allowing a CPU module to be horizontally inserted into the connector body.

Although the present invention has been illustrated and described with reference to the preferred embodiment thereof, it should be understood that it is in no way limited to the details of such embodiment but is capable of numerous modifications within the scope of the appended claims.

What is claimed is:

1. An electrical connector for horizontally mounting a CPU module relative to a circuit board, comprising:
    an elongate connector body having a longitudinal insert slot provided therein for receiving the CPU module, said longitudinal insert slot having a plurality of terminals provided along an interior of said longitudinal insert slot for electrically contacting the CPU module, said plurality of terminals having distal ends thereof protruding from said connector body; and
    a terminal positioning plate having a plurality of through holes formed therethrough corresponding to respective ones of said plurality of terminals,
    wherein said connector body is mated to said terminal positioning plate such that said longitudinal insert slot of said connector body and said terminal positioning plate are disposed in parallel planes,
    wherein said distal ends of said plurality of terminals are bent and inserted into respective said through holes provided in said terminal connecting plate.

2. The electrical connector as claimed in claim 1, wherein said longitudinal insert slot is provided with a plurality of terminal securing slots along opposing sidewalls of said longitudinal insert slot, wherein a respective one of said plurality of terminals is secured in a corresponding said terminal securing slot.

3. The electrical connector as claimed in claim 1, wherein said protruding distal ends of said plurality of terminals are bent 90° between said connector body and said terminal positioning plate.

4. The electrical connector as claimed in claim 1, wherein said connector body is provided with a first connecting member and said terminal positioning plate is provided with a second connecting member, wherein said connector body and said terminal positioning plate are mated by engaging said first and second connecting members.

5. The electrical connector as claimed in claim 4, wherein said first connecting member is a female member and said second connecting member is a male member insertingly engageable with said first connecting member.

6. The electrical connector as claimed in claim 4, wherein said first connecting member is provided at one end of said connecting body and said second member is provided in a corresponding end of said terminal positioning plate.

* * * * *